(12) United States Patent
Green

(10) Patent No.: US 6,922,107 B1
(45) Date of Patent: Jul. 26, 2005

(54) DUAL (CONSTANT VOLTAGE/CONSTANT CURRENT) BIAS SUPPLY FOR LINEAR POWER AMPLIFIERS

(75) Inventor: Ron Green, Santa Clara, CA (US)

(73) Assignee: Dynalinear Technologies, Inc., Campbell, CA (US)

(*) Notice: Subject to any disclaimer, the term of this patent is extended or adjusted under 35 U.S.C. 154(b) by 24 days.

(21) Appl. No.: 10/741,690

(22) Filed: Dec. 18, 2003

Related U.S. Application Data

(60) Provisional application No. 60/436,037, filed on Dec. 23, 2002.

(51) Int. Cl.[7] .................................................. H03F 3/04
(52) U.S. Cl. ...................... 330/296; 330/285; 330/288; 330/289
(58) Field of Search ............................... 330/296, 285, 330/288, 289

(56) References Cited

U.S. PATENT DOCUMENTS

| | | | | |
|---|---|---|---|---|
| 6,404,287 B2 | * | 6/2002 | Dening et al. | 330/296 |
| 6,617,928 B2 | * | 9/2003 | Finlay et al. | 330/288 |
| 6,771,129 B2 | * | 8/2004 | Riishøj et al. | 330/285 |
| 6,784,748 B1 | * | 8/2004 | Canyon et al. | 330/296 |
| 6,803,821 B1 | * | 10/2004 | DeFalco et al. | 330/288 |
| 6,842,075 B2 | * | 1/2005 | Johnson et al. | 330/296 |

* cited by examiner

*Primary Examiner*—Patricia Nguyen
(74) *Attorney, Agent, or Firm*—DLA Piper Rudnick Gray Cary US LLP

(57) ABSTRACT

An RF amplifier comprises a power amplifier and a dual bias circuit. A dual bias circuit comprises a constant current source and a constant voltage source for biasing the power amplifier. The power may include a heterojunction bipolar transistor (HBT) or a bipolar junction transistor (BJT).

1 Claim, 3 Drawing Sheets

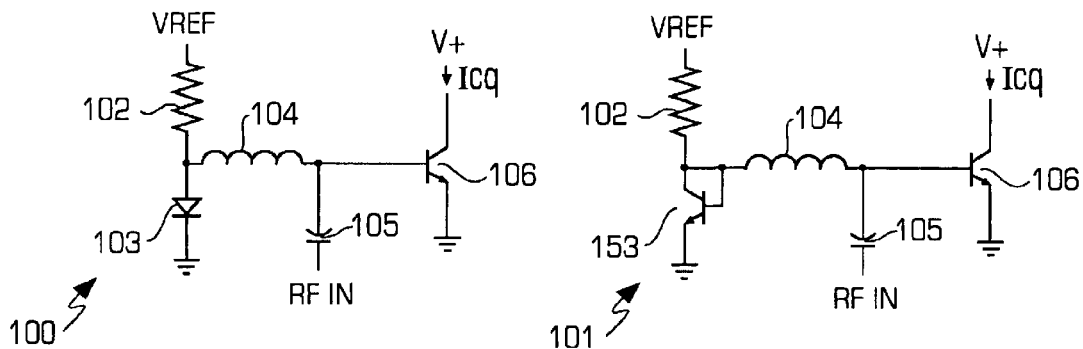
FIG. 1A PRIOR ART
FIG. 1B PRIOR ART
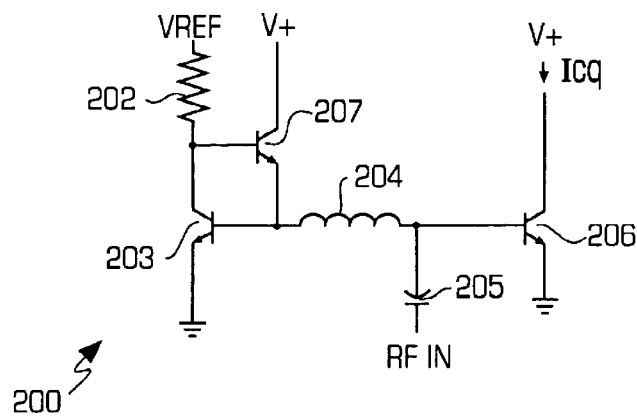
FIG. 2
PRIOR ART

DUAL (CONSTANT VOLTAGE/CONSTANT CURRENT) BIAS SUPPLY FOR LINEAR POWER AMPLIFIERS This application claims the benefit of U.S. Provisional Application No. 60/436,037, filed Dec. 23, 2002.

BACKGROUND

The invention relates to a linear (e.g., CDMA) RF power amplifier bias networks, and more particularly to a linear RF power amplifier including a dual bias supply for maintaining a constant quiescent operating bias point over temperature and a range of control voltages.

For constant envelope bipolar transistor based power amplifiers (GSM, FM) generally all that is required of a bias network is to set the bias point for the class of operation desired, and to track the base voltage with temperature to maintain a stable operating point. This is easily obtained with a passive bias scheme (current Mirror/constant current CC) as shown in FIG. 1, described below. The "on chip" diode or the diode connected transistor track the RF power device base voltage very well whether implemented in silicon or the lower thermally conductive GaAs substrates. Also with this approach there is little variation in bias point with any change in a control voltage, Vref. This can be important in the typical high volume wireless consumer market where high accuracy/high cost voltage regulators are not required. The main problem with this style of bias supply is its high internal impedance, a resistor 102 when applied to non-constant envelope modulation schemes (e.g., CDMA, W-CDMA, and QPSK). For example, CDMA modulation (IS-95 standard) has a +3 dB to −11 dB peak to average instantaneous (at 1.25 MHz modulation rate) amplitude variations. To support the instantaneous +3 dB (2 times) increase in power the output RF transistor's current will need double (constant supply voltage), requiring the base current to also double. With the basic current mirror (FIG. 1), the resistor 102 is large to keep the bias diode transistor small and to minimize current drain, doubling the supplied current results in doubling the voltage drop across the resistor 102. This drops the base voltage accordingly which is significant as the collector current is exponentially related to the base emitter voltage Vbe. With a lower base voltage the RF power transistor collector current cannot follow the AM (+3 dB) component of the modulation and distortion results. The larger the internal bias resistance, typically 1000 ohms or more, the more distortion occurs.

A more traditional bias approach for non-constant envelope modulation schemes uses a current mirror with a current boost pass transistor (see for example FIG. 2 described below) as a constant voltage source. This approach has the advantage of much lower output resistance, typically 2 orders of magnitude or 100 times less , due to active feedback, thus enabling instantaneous tracking of the linear modulation. This means that the base voltage can be held much more stable under the demands of linear modulation as described above, yielding a more linear RF amplifier especially at higher powers that can result in a higher efficiency linear RF amplifier. Two issues remain for this type of bias; first, the inclusion of the pass transistor reduces the temperature tracking accuracy of the current mirror, and second, the circuit is very sensitive to Vref requiring high accuracy/higher cost voltage regulators.

Another approach, sometimes known as buffered passive bias, includes both resistive and a modified active bias circuit (see for example, FIG. 3 described below). Both parts provide temperature compensation along with minimizing the current drain for the bias circuit. While this approach has good temperature tracking characteristics, the output impedance of the bias circuit is much higher than optimal for non-constant envelope modulation schemes. The impedance of the temperature compensating circuit is further increased with the resistors 312, 314, and 315 while the output impedance is increased by any or all the resistors 304, 312, 317, and 318. The output impedance, disregarding the above listed resistors, is typically an order of magnitude (or ten higher) than that of the above current mirror with current boost. This is due to reducing the reference transistor to a diode by shorting out the collector/base junction. Also this form can also have a higher sensitivity to the output impedance changing with RF power resulting in a more pronounced gain expansion leading to possibly more distortion.

SUMMARY OF THE INVENTION

The present invention provides a dual bias supply for a power amplifier. The dual bias supply comprises a constant current source and a constant voltage source that each bias the power amplifier. In one aspect, the power amplifier is a heterojunction bipolar transistor (HBT) in GaAs or SiGe. A capacitor may couple the RF input to the base of the RF amplifier. An inductor/capacitor may couple the dual bias circuit to the base of the heterojunction bipolar transistor.

In one aspect, the constant current source comprises a first resistor coupled between a reference voltage and the collector of a first transistor that includes an emitter coupled to ground. A boost/feedback transistor includes a base coupled to the collector of the first transistor, includes a collector coupled to a supply voltage, and includes an emitter coupled to the base of the first transistor. Another boost transistor may be coupled in a similar manner. A second resistor may be coupled between the base of the first transistor and ground. A third resistor may be coupled between the emitters of the boost transistors. The emitter of the second boost transistors is coupled to the output of the dual bias circuit. A fourth resistor is coupled between the reference voltage and the collector and base of a diode connected second transistor that includes an emitter coupled to ground by a fifth resistor. A sixth resistor can be coupled between the collector of the second transistor and the emitter of the second boost circuit and to the output of the dual bias circuit.

BRIEF DESCRIPTION OF THE DRAWINGS

FIGS. 1A and 1B are schematic diagrams illustrating conventional power amplifiers comprising diode bias and current mirror circuits, respectively.

FIG. 2 is a schematic diagram illustrating a conventional power amplifier comprising an analog current mirror circuit that includes a current boost transistor.

DETAILED DESCRIPTION

Figure 3:
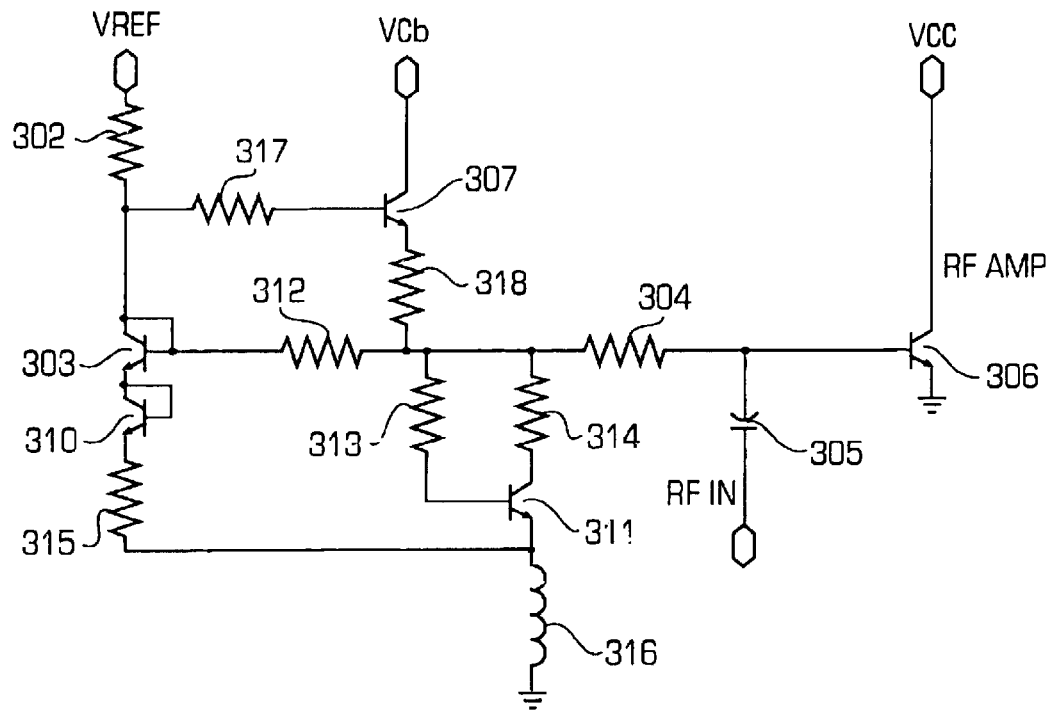
FIG. 3 is a schematic diagram illustrating a conventional power amplifier comprising a current mirror circuit including a temperature compensated current boost transistor.

FIGS. 1A and 1B are schematic diagrams illustrating conventional power amplifiers 100 and 101, respectively, that include respective diode bias and current mirror circuits for nonlinear amplifiers having a constant envelope.

The power amplifier 100 comprises a diode bias circuit including a resistor 102 and a diode 103 serially connected to bias a radio frequency (RF) transistor 106. A capacitor 104 is an RF coupling capacitor of an RF signal from a previous stage and functions as a DC block for the bias supply. An inductor 104 functions as a large impedance to inhibit any RF from the bias supply.

The power amplifier 101 comprises a current mirror circuit including a resistor 102 and a transistor 153 serially connected to bias the RF transistor 106.

The power amplifiers 100 and 101 track temperature well because the referenced diode junctions of the diode 103 and the transistor 153 are on the same die as the RF device (transistor 106). The amplifiers 100 and 101 are also quite insensitive to control voltage variations due to the relatively large resistance of the resistor 102. However, for linear amplifiers having a non-constant envelope modulation and the source impedance of the bias circuit (i.e., the resistance of the resistor 102) typically being very high, the linearity is very poor. So although these bias circuits can track voltage changes over temperature of the RF device accurately, they cannot dynamically change their current sourcing (low output resistance) as used by modern linear amplifiers.

FIG. 2 is a schematic diagram illustrating a conventional power amplifier 200 comprising an analog current mirror circuit that includes a current boost transistor 207.

The power amplifier 200 comprises a current mirror circuit that includes a resistor 202 and a transistor 203 serially connected to bias a radio frequency (RF) transistor 206. A current boost transistor 207 is coupled to the transistor 203. A capacitor 204 is an RF coupling capacitor of an RF signal from a previous stage and functions as a DC block for the bias supply. An inductor 204 functions as a large impedance to inhibit any RF from the bias supply.

The current mirror circuit of the amplifier 200 solves the problem of the bias circuits of the amplifiers 100 and 101 of FIGS. 1A and 1B, respectively, because the feedback circuit of the transistors 203 and 207 significantly reduce the output impedance of the bias circuits, so that the circuit can drive the base of the linear power amplifier (transistor 206) without causing excess distortion. However, because of the addition of the transistor 207, the temperature tracking ability of the current mirror circuit of the amplifier 200 may be reduced significantly.

FIG. 3 is a schematic diagram illustrating a conventional power amplifier 300 comprising a current mirror circuit including a temperature compensated current boost transistor.

The power amplifier 300 comprises a current mirror circuit that includes a resistor 302, diode connected transistors 303 and 310 and a resistor 315 serially connected through an inductor 316 to bias a radio frequency (RF) transistor 306. An emitter follower transistor 307 is coupled to the transistor 303 with resistors 318 and 312 coupled between the emitter of the transistor 307 and the base of the transistor 303 and a resistor 317 coupled between the collector of the transistor 303 and the base of the transistor 307. A resistor 313 couples the common node of the resistors 312 and 318 to the base of the transistor 311. A resistor 314 couples this common node to the collector of the transistor 311. The emitter of the transistor 311 may be inductively coupled by the inductor 316 to ground. A capacitor 305 is an RF coupling capacitor of an RF signal from a previous stage and functions as a DC block for the bias supply. A resistor 304 functions to inhibit RF from the bias supply.

The bias circuit of the amplifier 300 includes two reference diode junctions from the transistors 303 and 310. One reference diode junction compensates for the temperature performance of the boost transistor 307 and the other reference diode junction compensates for the temperature performance of the RF transistor 306. The transistor 311 is a scaled temperature load to trim in the Icq (collector current in transistor 306) variations in temperature. However, this bias circuit has a relatively poor output impedance because of no active feedback, and just an emitter follower. This results in poorer RF linearity as the bias supply is less able to instantly track the digital modulation while maintaining a constant VBE due to a higher source impedance.

Figure 4:
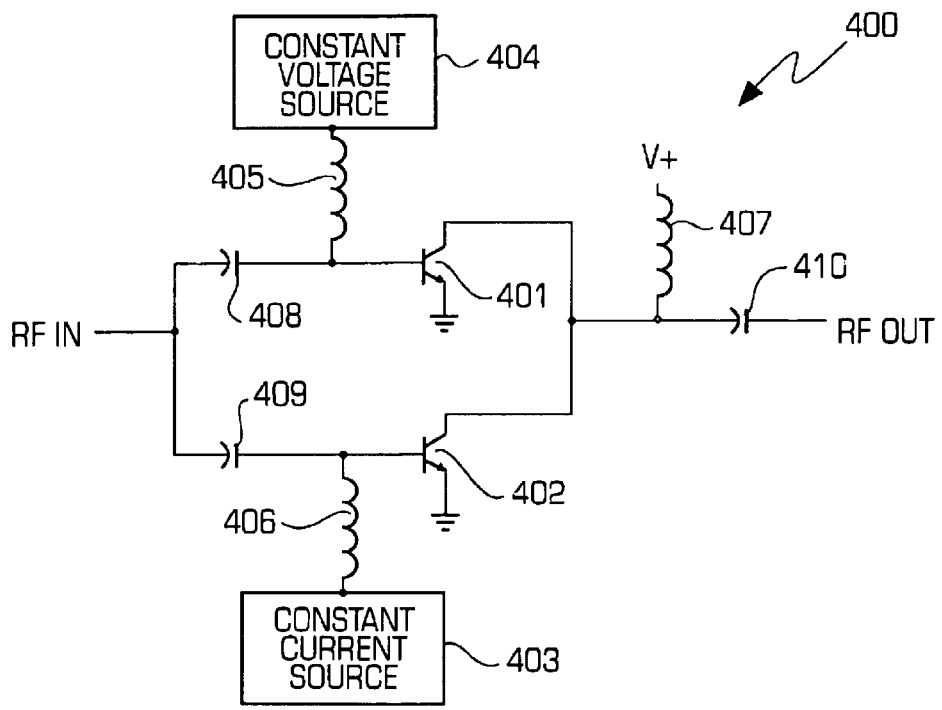
FIG. 4 is a schematic diagram illustrating a conventional heterojunction bipolar transistor (HBT) power amplifier including two separate bias supplies.

FIG. 4 is a schematic diagram illustrating a conventional heterojunction bipolar transistor (HBT) power amplifier 400 including two separate bias supplies. The HBT power amplifier 400 uses constant voltage and constant current applied to two parallel RF amplifiers 401 and 402. A constant current supply 403 is connected through an inductor 405 to the RF amplifier 402. A constant voltage supply 404 is coupled through an inductor 406 to the RF amplifier 402. Capacitors 408 and 409 are RF coupling capacitors of an RF signal from a previous stage to the respective amplifiers 401 and 402. A capacitor 410 is an RF coupling capacitor of the output RF signal. Near the pinch off region, the power amplifier 401 coupled to the constant voltage bias has a positive gain expansion versus the output power, while the power amplifier 402 coupled to the constant current bias has a negative gain expansion versus the output power. By selecting the ratio between the sizes of the two RF amplifiers 401 and 402 and the initial bias conditions for each base drive for the HBT, the gained deviations may be cancelled out and better linearity is achieved.

Figure 5:
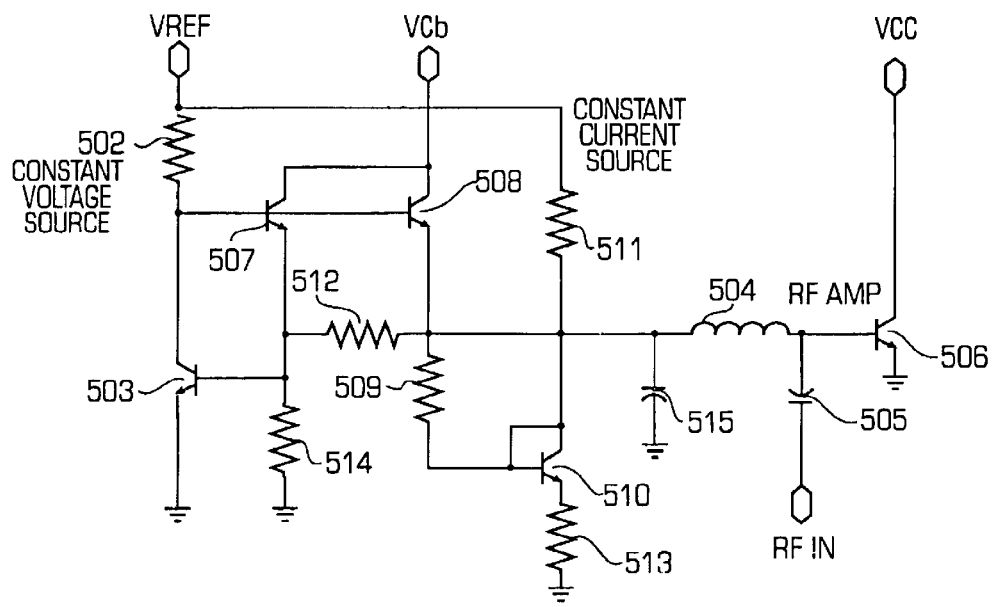
FIG. 5 is a schematic diagram illustrating a HBT power amplifier according to the present invention.

FIG. 5 is a schematic diagram illustrating a HBT power amplifier 500 according to the present invention.

The power amplifier 500 includes a current mirror and a temperature compensation current boost transistor to obtain a dual constant current/constant voltage supply. This results in a bias supply that combines the benefits of both approaches of the prior art circuits of FIGS. 1, 2 and 3, while reducing the negative aspects of either.

The power amplifier 500 comprises a current source formed of a resistor 511 and a diode connected transistor 510 coupled in series with an emitter resistor 513, and further comprises a voltage source formed of a resistor 502 and a transistor 503 coupled in series, and a plurality of boost transistors 507 (as a feedback stage) and 508 (as an emitter follower). In one embodiment, a resistor 512 is coupled between the emitters of the boost transistors 507 and 508. In another embodiment, the emitters of the boost transistors 507 and 508 are coupled together or are separated.

The current source, which includes a diode bias/current mirror, increases the base-emitter voltage (VBE) tracking with temperature because the reference diode junction is on the same die as an RF transistor 506 and is trimmed to the value by the resistor 512, and is quite insensitive to control voltage variations due to the relatively large resistance of the resistor 502.

The voltage source is a current mirror with the current boost transistor 507 and the transistor 503 forming a feedback circuit, with a resistor 514 setting the bias point of the transistor 503, so that the output impedance of the bias circuit is significantly reduced for the bias circuit to drive the base of the linear power amplifier 506 without causing excess distortion. The split transistor pair 507/508 isolates the feedback transistors from RF leaking through the inductor 504.

The resistor 511 biases the diode connected transistor 510 so that the resistor 511 and the transistor 510 flatten the reference voltage (Vref) sensitivity of the Icq current (collector current in the transistor 506) by providing a voltage clamp as well as tracking VBE voltage changes with temperature as the amplifiers 100 and 101 (FIGS 1A and 1B). This enables the RF transistor 506 to start to be turned on at about 1.25 volts instead of the 2.4 volts of the more standard current mirror with boost (FIG. 2) resulting in the flatter Vref sensitivity around the operating point of about 2.8 volts. The resistor 509 combines both the current source and voltage source, and may be zero ohms (a short).

A capacitor 505 is an RF coupling capacitor of an RF signal from a previous stage and functions as a DC block for the bias supply. An inductor 504 functions as a large impedance while a capacitor 515 shunts any RF leaking through the inductor 504 to ground to further inhibit any RF from the bias supply. Any significant RF present on the reference/feedback circuit of transistors 503 and 507 causes self biasing to occur and impair performance of the bias circuit as a function of RF output power.

The power amplifier 500 provides very good temperature tracking and insensitivity to a control voltage while maintaining low output impedance to ensure good RF linearity for non-constant envelope digital modulation type power amplifiers.

What is claimed is:

1. A circuit comprising:

a power amplifier;

a dual bias supply to bias the power amplifier, the dual bias supply comprises:

a first transistor including an emitter coupled to ground, a first resistor coupled between a reference voltage node and a collector of the first transistor, a second transistor including a base coupled to the collector of the first transistor, including a collector coupled to a supply voltage node, and including an emitter coupled to the base of the first transistor, a second resistor coupled between the base of the first transistor and the ground node, a third transistor including a collector coupled to the base of the third transistor, a third resistor coupled between the reference voltage node and the common node formed of the collector and base of the third transistor, a fourth resistor coupled between the emitter of the third transistor and ground, and a fifth resistor coupled between the base of the third transistor and a common node formed of the emitter of the second transistor and a base of the power amplifier.

* * * * *